United States Patent [19]

Matsuoka

[11] Patent Number: 5,256,079
[45] Date of Patent: Oct. 26, 1993

[54] IC SOCKET

[75] Inventor: Noriyuki Matsuoka, Yokohama, Japan

[73] Assignee: Yamaichi Electric Co., Ltd., Tokyo, Japan

[21] Appl. No.: 865,582

[22] Filed: Apr. 8, 1992

[30] Foreign Application Priority Data

Apr. 18, 1991 [JP] Japan .................. 3-115294

[51] Int. Cl.⁵ .............................. H01R 4/50
[52] U.S. Cl. ........................ 439/342; 439/264
[58] Field of Search ............. 439/259, 261–266, 439/268–270, 342

[56] References Cited

U.S. PATENT DOCUMENTS 4,377,319  3/1983  MacDougall ............... 439/264
4,744,768  5/1988  Rios ........................... 439/262

FOREIGN PATENT DOCUMENTS 62-278778 12/1987 Japan .

OTHER PUBLICATIONS

IBM Technical Bulletin, vol. 33, No. 8, Jan. 1991.

Primary Examiner—Larry I. Schwartz
Assistant Examiner—Khiem Nguyen
Attorney, Agent, or Firm—Wenderoth, Lind & Ponack

[57]  ABSTRACT

To remove a contact condition between a contact and a lead of an IC package, a movable plate is moved forwardly from a control position to a release position by pivoting a crank lever, which includes a crank shaft portion having an eccentric shaft portion, from a starting point to a terminal point. The starting point of the forward pivotal movement of the eccentric shaft portion of the crank shaft portion is set in a third or fourth quadrant of a rectangular coordinate system with its origin at the rotation axis of the crank shaft portion (i.e. the starting point of the central axis of the eccentric shaft portion is disposed below the rotation axis of the crank shaft portion).

14 Claims, 7 Drawing Sheets

IC SOCKET

BACKGROUND OF THE INVENTION

1. Field of the Invention

This invention relates to an IC socket in which a movable plate is movable in a horizontal direction by a pivotal operation of a crank lever, to thereby establish or release a contact condition or relationship between a contact on a socket body and a lead on an IC package.

2. Brief Description of the Prior Art

Laid-open (Kokai) Japanese Patent Application No. 278778/87 discloses an IC socket in which a movable plate having a number of lead insertion through-holes is placed on an upper surface of a socket body provided with contacts, and the movable plate is movable in a horizontal direction by a pivotal operation of a crank lever, to thereby establish or release a contact condition or relation between the contacts and IC leads. This IC socket is widely used as a socket for a pin grid array type IC which requires high inserting and removing loads.

The above crank lever is provided with an operating shaft portion and a crank shaft portion which are disposed perpendicular with respect to each other. As shown in FIGS. 1(A), 1(B), and 1(C), the crank shaft portion $3a$ is disposed between the socket body 1 and the movable plate 2. The crank shaft portion $3a$ is rotated about a fixed fulcrum on a side of the socket body 1 by a pivotal operation of the operating shaft portion and at the same time, the eccentric shaft portion $3b$ is eccentrically pivoted about the fixed fulcrum of the crank shaft portion $3a$ on the side of the movable plate 2. This eccentric pivotal force is applied to the movable plate 2 in order to move it forwardly or backwardly along the upper surface of the socket body 1 depending on the pivotal direction of the eccentric shaft portion $3b$. Upon a forward movement of the movable plate 2, the IC lead, which had been inserted between contact pieces of each of the contacts through a corresponding lead insertion through-hole formed in the upper surface of the movable plate 2, is retracted therefrom, thus enabling a no-load insertion and removal. Furthermore, the lead is inserted between the contact pieces upon a backward movement of the movable plate.

Accordingly, the eccentric shaft portion $3b$ is effective to establish a contact condition or relation between the IC lead and the contact moved to a starting point $P_1$ of its pivotal movement, and to remove the contact condition or relation therebetween when moved to a terminal point $P_2$ of its pivotal movement.

In the above prior art, in order to achieve the contact or contact release condition, the starting point $P_1$ of the pivotal movement of the eccentric shaft portion $3b$ is set in a second or third quadrant of the coordinates which are formed by an X-axis and a Y-axis passing through a central point of the pivotal movement of the crank shaft portion $3a$, and the eccentric shaft portion $3b$ is eccentrically pivoted clockwise from the starting point $P_1$ of the pivotal movement set in the second quadrant towards the terminal point $P_2$ of the pivotal movement set in the first quadrant. Alternatively, the eccentric shaft portion $3b$ is eccentrically pivoted counterclockwise from the starting point $P_1$ of the pivotal movement set in the first quadrant towards the terminal point $P_2$ of the pivotal movement set in the second quadrant.

Whether the starting point $P_1$ of the pivotal movement is set in the second quadrant or to the first quadrant depends on whether the crank shaft portion $3a$ is disposed at one side of the socket body 1 and movable plate 2 or the other side thereof.

As discussed above, the eccentric shaft portion $3b$ has the starting point $P_1$ of the pivotal movement set in the second or first quadrant about the crank shaft portion, and the contact condition between the contact and the IC lead is established when the eccentric shaft portion $3b$ is positioned at this starting point $P_1$ of the pivotal movement.

When an external force W attempting to move the movable plate 2 forwardly is applied thereto when the eccentric shaft portion $3b$ is positioned at the starting point $P_1$ of the pivotal movement in the second or first quadrant, component forces $W_1$ and $W_2$ directed in a horizontal direction along the X-axis and in an upward direction along the Y-axis as shown in FIGS. 1(A) and 2, act against the eccentric shaft portion $3b$. These component forces $W_1$, $W_2$ positively act to urge the movable plate 2 in the forward direction. As a result, the contact condition of the IC is likely to be removed. It will be understood that this unfavorable phenomenon occurs because of the fact that the starting point $P_1$ of the pivotal movement of the eccentric shaft portion $3b$ is located above the X-axis which passes through the center of the crank shaft portion $3a$ (i.e., in the second or first quadrant).

As one attempt for preventing this unfavorable phenomenon, heretofore, the movable plate 2 has been provided with a braking projection projecting from a side surface of the movable plate 2 to engage with an operating shaft portion of the crank lever. However, because this projection must be tiny so that the operating shaft portion can easily climb over it, the crank lever accidentally climbs over this tiny projection when an external force applied to the movable plate is large, with the result that a contact release condition is undesirably established.

The above situation becomes even worse when the operating lever is operated to move between its vertical position and its horizontal position repeatedly, because the tiny projection becomes worn. Moreover, when an external force acting on the movable plate in an attempt to move it forwardly is excessively large, the tiny projection can be broken. As a result, the function of the projection in holding the crank lever at the starting point (i.e., contact position) of the pivotal movement is lost. This problem is also true when the eccentric shaft portion is located on the X-axis.

As a result of use of the prior art device for many years, the above problems became manifest. The present invention is made in order to solve the above problems.

SUMMARY OF THE INVENTION

It is therefore an object of the present invention to provide an IC socket, for which, when an external force attempting to move a movable plate forwardly from its starting point at which it maintains a contact condition between a contact and an IC lead, a crank lever for moving the movable plate acts against the external force to prevent the forward movement of the movable plate and satisfactorily maintain the contact condition.

To achieve the above object, according to one aspect of the present invention, there is provided an IC socket comprising a socket body, a movable plate capable of moving in a horizontal direction along an upper surface of the socket body, and a crank lever for moving the movable plate in the horizontal direction. The crank lever includes an operating shaft portion and a crank shaft portion bent at a generally right angle with respect to the operating shaft portion. The crank shaft portion includes an eccentric shaft portion and is disposed between the socket body and the movable plate. The crank shaft portion is pivoted through a predetermined sector-like pivotal angle upon a corresponding clockwise pivotal movement of the operating shaft portion, and at the same time, the eccentric shaft portion is eccentrically pivoted about the crank shaft portion such that an eccentric pivotal force is applied to the movable plate to move the same in the horizontal direction. In this manner, a contact condition or a contact release condition between a lead on an IC package and a contact on the socket body is established by the horizontal movement of the movable plate A starting point of the pivotal movement of the eccentric shaft portion, which establishes the contact condition between the contact and the lead, is set in a third quadrant of the coordinates formed by an X-axis and a Y-axis both passing through a central point of the pivotal movement of the crank shaft portion. A terminal point of the pivotal movement, which establishes the contact release condition between the contact and the lead, is set in a second or first quadrant.

According to another aspect of the present invention, there is also provided an IC socket comprising a socket body, a movable plate capable of moving in a horizontal direction along an upper surface of the socket body, and a crank lever for moving the movable plate in the horizontal direction. The crank lever includes an operating shaft portion and a crank shaft portion bent at a generally right angle with respect to the generating shaft portion. The crank shaft portion includes an eccentric shaft portion and is disposed between the socket body and the movable plate. The crank shaft portion is pivoted through a predetermined sector-like pivotal angle upon a corresponding counterclockwise pivotal movement of the operating shaft portion, and at the same time, the eccentric shaft portion is eccentrically pivoted about the crank shaft portion such that an eccentric pivotal force is applied to the movable plate to move the same in the horizontal direction. In this manner, a contact condition or a contact release condition between a lead on an IC package and a contact on the socket body is established by the horizontal movement of the movable plate. A starting point of the pivotal movement of the eccentric shaft portion, which establishes the contact condition between the contact and the lead, is set in a forth quadrant of the coordinates formed by an X-axis and a Y-axis both passing through a central point of the pivotal movement of the crank shaft portion. A terminal point of the pivotal movement, which establishes the contact release condition between the contact and the lead, is set in a first or second quadrant.

In an IC socket thus constructed, when an external force attempting to move the movable plate in a horizontal direction is applied thereto, it positively acts as a force for which would tend to pivot the eccentric shaft portion located below of the X-axis of the crank shaft (i.e., eccentric shaft portion having a starting point of the pivotal movement in the third or fourth quadrant) in a direction opposite the direction towards the terminal point of the pivotal movement and away from the starting point of the pivotal movement.

As a result, the eccentric shaft portion is maintained at the starting point of the pivotal movement, and is acted upon by a reverse pivotal force. Thus, the movable plate is urged in a direction opposite the contact releasing direction (forward direction), thus enabling a favorable contact condition or relation between the IC lead and the contact to be maintained.

DETAILED DESCRIPTION OF THE INVENTION

Figure 1A:
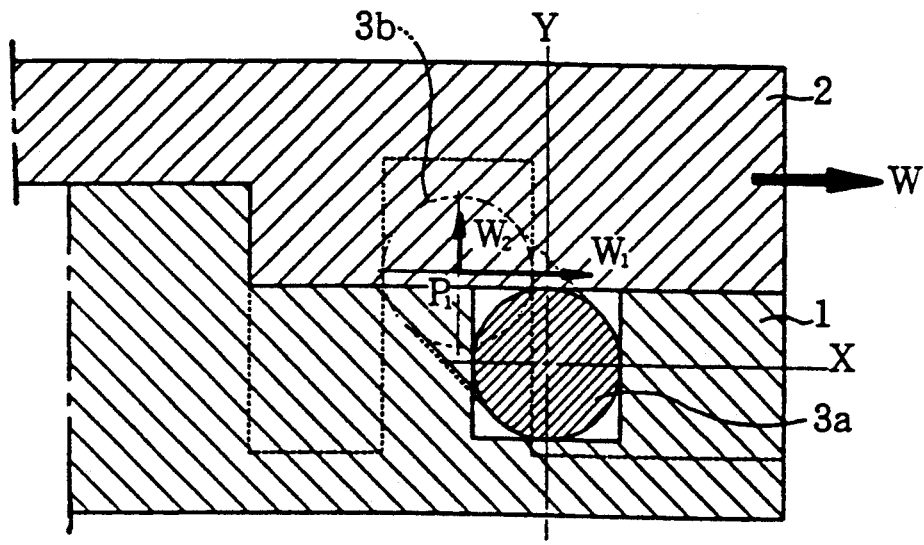
FIG. 1(A) is a sectional view of an important portion of a conventional IC socket in which an eccentric shaft portion of a crank lever is located at the starting point of a pivotal movement.
Figure 1B:
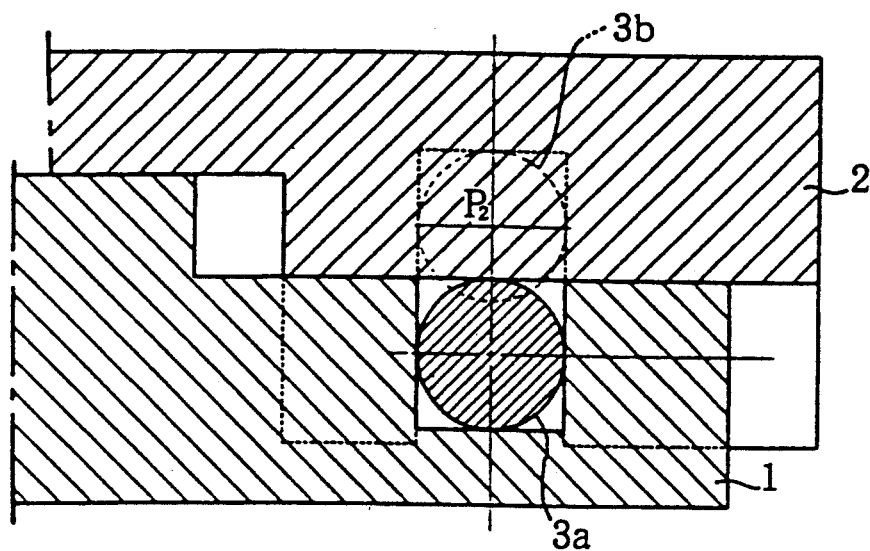
FIG. 1(B) is a sectional view similar to FIG. 1(A), but showing the eccentric shaft portion of the crank lever located at a mid-point of the pivotal movement.
Figure 1C:
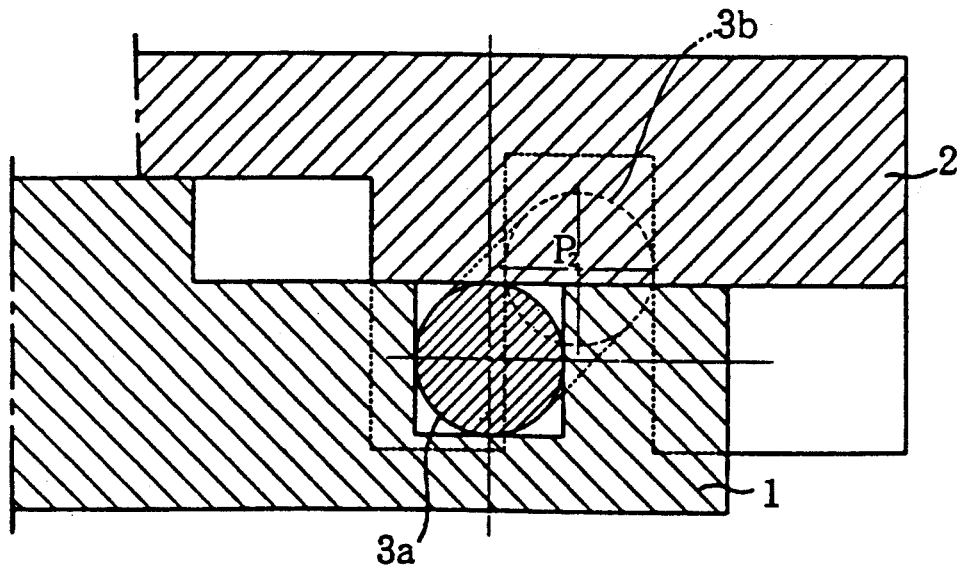
FIG. 1(C) is a sectional view similar to FIGS. 1(A) and 1(B), but showing the eccentric shaft portion of the crank lever located at the terminal point of the pivotal movement.
Figure 2:
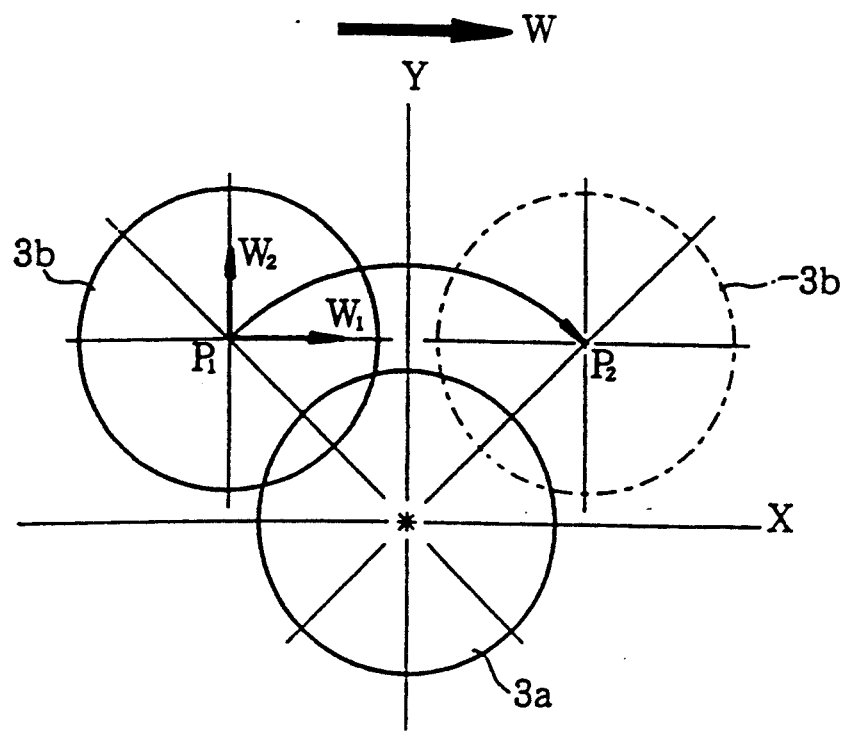
FIG. 2 is an explanatory view for diagrammatically explaining an arrangement of the eccentric shaft portion and a locus of the pivotal movement in the above conventional IC socket.

The constitution of the present invention will now be described in the form of one preferred embodiment with reference to FIGS. 3 through 10 inclusive.

An IC socket embodying the present invention comprises a crank lever 3 as a means for horizontally moving a movable plate. The crank lever 3 is bent to a generally right angle at an intermediate portion thereof, one part or section of the crank lever 3 forming a crank shaft 3a and the other part or section forming an operating shaft 3c. The crank shaft 3a is provided at an intermediate portion thereof with an eccentric shaft portion 3b.

The movable plate 2 is horizontally placed on an upper surface of a socket body 1 in such that it is movably along the upper surface of the socket body 1 in a horizontal direction. An IC package 5 is placed on an upper surface of the movable plate 2, and inserted into the socket body 1 while thrusting IC leads 5a into corresponding lead-insertion holes (through-holes) 2a which are formed in the upper surface of the movable plate 2, so that the IC leads 5a can be contacted with and released from contact with the corresponding contacts.

The crank shaft 3a of the crank lever 3 is disposed at first end portions of the socket body 1 and movable plate 2 thus constructed. The crank shaft 3a is slidably fit in a shaft bearing groove 1a of the socket body 1, and the eccentric shaft portion 3b is slidably fit in a shaft bearing groove 2b of the movable plate 2. By virtue of the arrangement just mentioned, the eccentric shaft portion 3b is eccentrically pivoted about the crank shaft portion 3a upon pivotal operation of the crank lever 3. As a result, an eccentric pivotal force is applied to the movable plate 2, so that the latter will move in the horizontal direction.

The crank shaft portion 3a is disposed between the socket body 1 and the movable plate 2, and the operating shaft portion 3c is pivotable clockwise at a predetermined sector-like pivotal angle. When the crank shaft 3 is pivoted clockwise to move the movable plate 2 forwardly as shown in FIGS. 3 through 9, the starting point $P_1$ of the pivotal movement of the eccentric shaft portion 3b is set in the third quadrant of the coordinates formed by an X-axis and a Y-axis passing through a central point (i.e. the axis of rotation) of the pivotal movement of the crank shaft portion 3a, and a terminal point $P_2$ of the pivotal movement is set in the first or second quadrant, so that when the eccentric shaft portion 3b is located at the starting point $P_1$ of the pivotal movement in the third quadrant, the IC lead 5a and the contact 4 will be in contact with each other. Similarly, when the eccentric crank shaft portion 3b is pivoted clockwise from the starting point $P_2$ of the pivotal movement in the third quadrant to the terminal point $P_2$ in the second or first quadrant as shown in FIGS. 9(A) and 9(B), the IC lead 5a and the contact 4 are released from contact with each other. According to a modified embodiment of the present invention, the terminal point $P_2$ of the pivotal movement may be located on the Y-axis between the first quadrant and the second quadrant.

Figure 3:
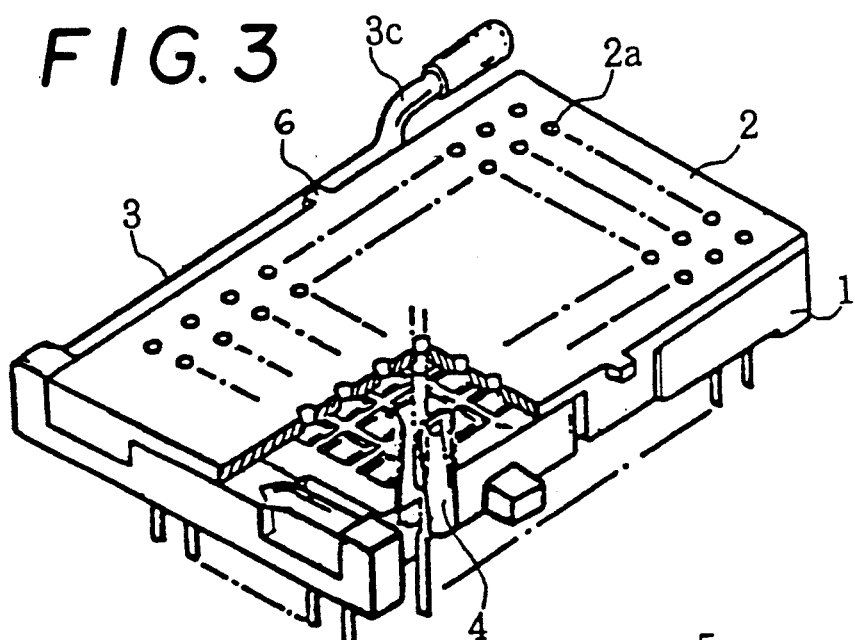
FIG. 3 is a perspective view, partly cut-away, of an IC socket according to the present invention.
Figure 4:
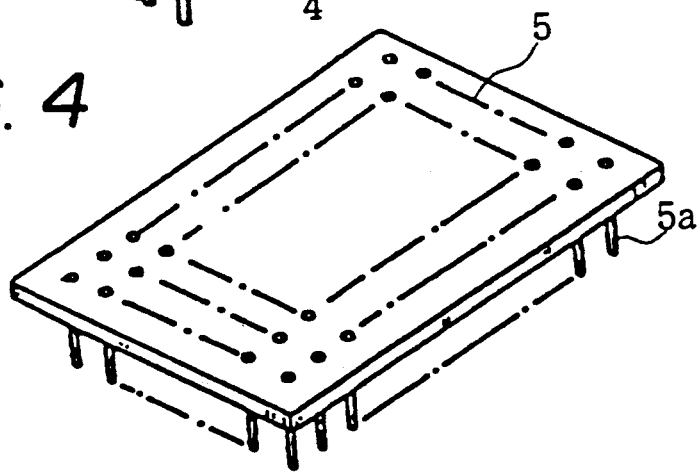
FIG. 4 is a perspective view showing an outer appearance of the IC socket of FIG. 3 and an IC package.
Figure 4:
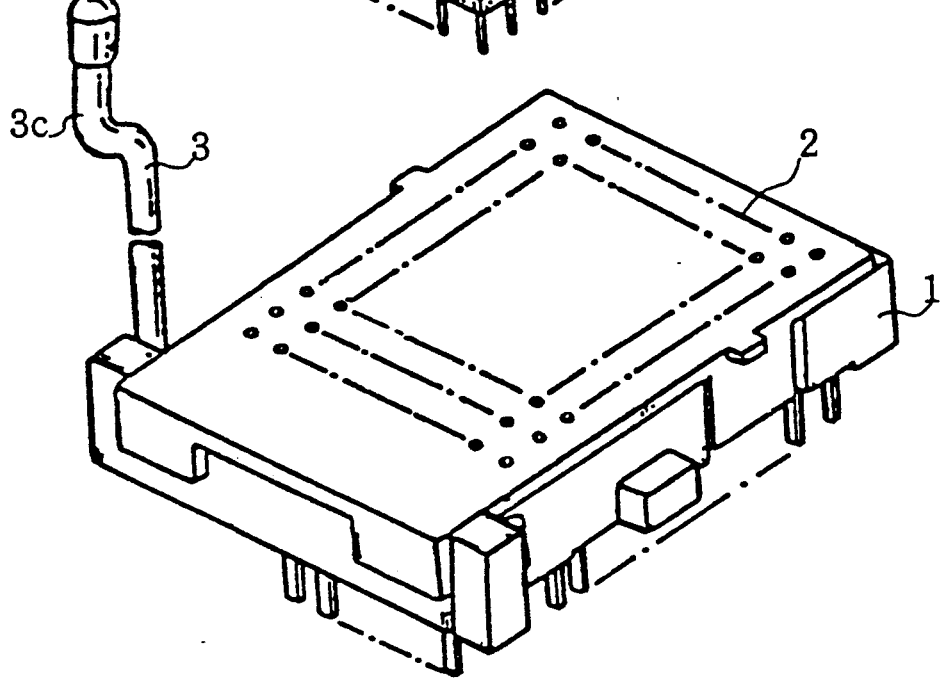
Figure 5:
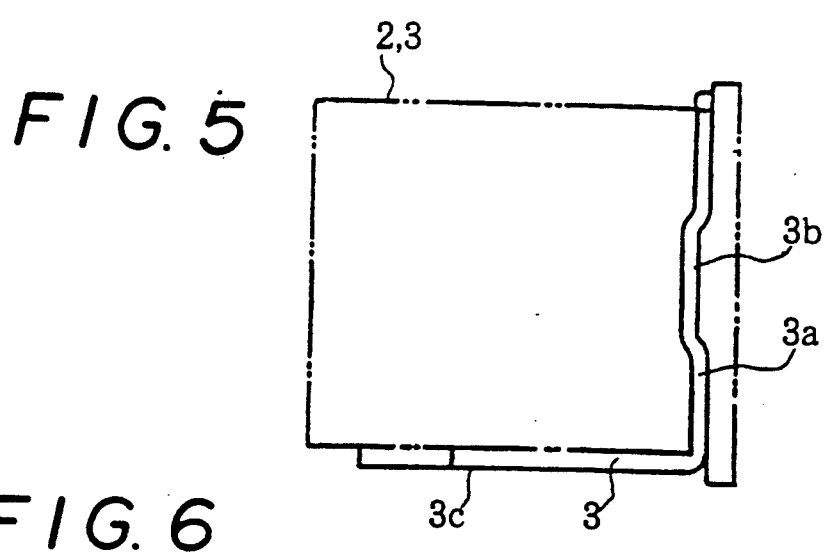
FIG. 5 is a plan view of the IC socket of FIG. 3 with a crank lever shown in its horizontal position.
Figure 6:
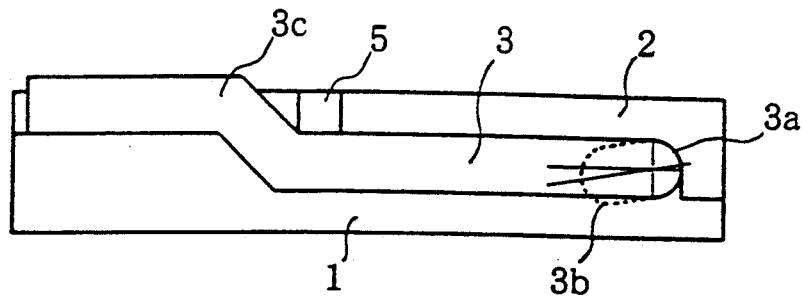
FIG. 6 is a side view of FIG. 5.
Figure 7:
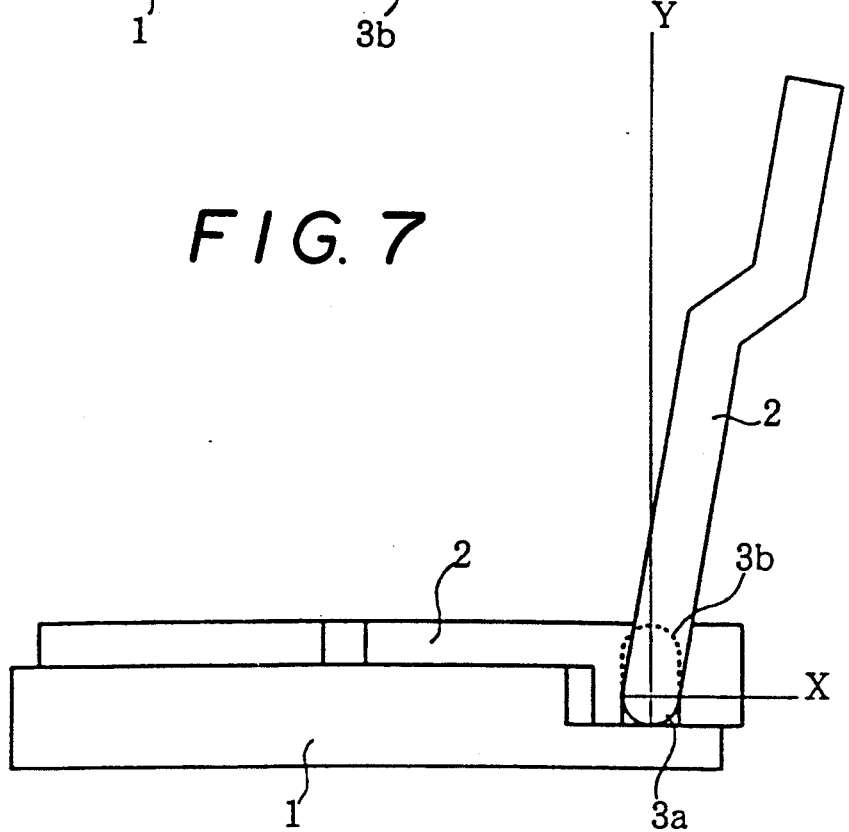
FIG. 7 is a side view similar to FIG. 6, but with the crank lever raised to its vertical position (upright position)

As shown in FIGS. 3 and 6, the operating shaft portion 3c of the crank lever 3 is in a horizontal position along the side surface of the socket body 1 when the eccentric shaft portion 3b is located at the starting point $P_1$ of the pivotal movement in the third quadrant, and the operating shaft portion 3c is in a vertical position (upright position) when the eccentric shaft portion 3b is located at the terminal point $P_2$ of the pivotal movement in the first or second quadrant.

When the operating shaft portion 3c of the crank lever 3 is moved into its vertical position from its horizontal position, the eccentric shaft portion 3b is eccentrically pivoted from the starting point $P_1$ of the pivotal movement to the terminal point $P_2$ of the pivotal movement and the movable plate 2 is moved in the horizontal direction by the force exerted by the eccentric shaft portion 3b during this eccentric pivoting. As a result, the IC package 5 and its lead 5a are moved in the horizontal direction together with the movable plate 2, so that the IC lead 5a can be retracted from contact with the contact pieces of the contact 4, thus releasing the contact condition. In the foregoing condition, the IC package 5 can be inserted and removed with no-load.

In contrast, when the operating shaft portion 3c of the crank lever 3 is pivoted from its vertical position into its horizontal position, the eccentric shaft portion 3b is eccentrically pivoted from the terminal point $P_2$ of the pivotal movement in the first or second quadrant to the starting point $P_1$ of the pivotal movement in order to move the movable plate 2 backwardly. As a result, the IC package 5 and IC lead 5a are moved backwardly together with the movable plate 2, so that the lead 5a is held between the contact pieces of the contact 4, to thereby establish the contact condition therebetween. In order to maintain this contact condition, the movable plate 2 is provided with a braking projection 6 formed on a side surface thereof, this projection 6 being designed such that the operating shaft portion 3c is incapable of climbing over it with ease, and the operating shaft portion 3c is engaged with this projection 6.

Figure 10:
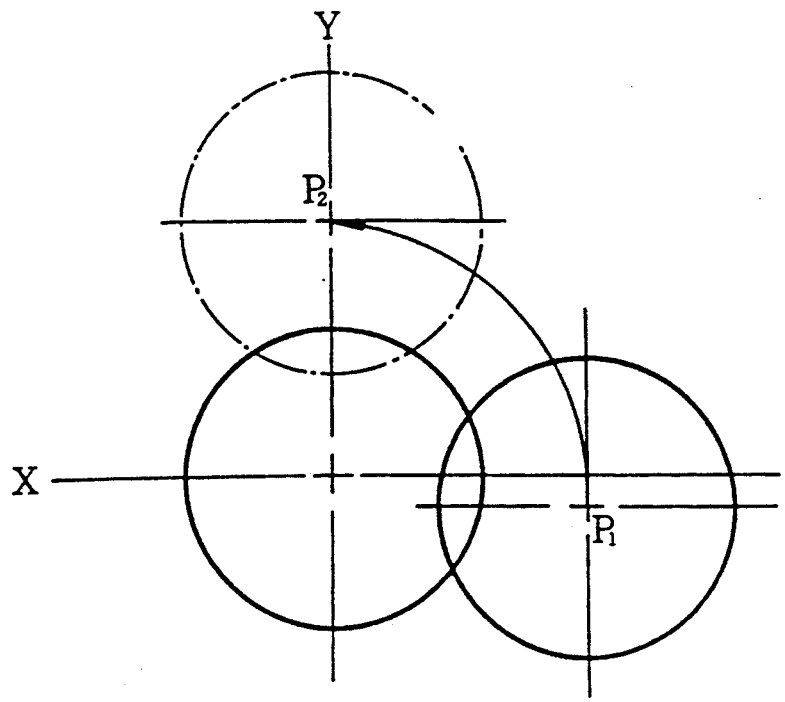
FIG. 10 is an explanatory view for diagrammatically explaining an arrangement of an eccentric shaft portion and a locus of a pivotal movement in a modified embodiment of the present invention.

When the arrangement is such that the crank lever 3 is pivotable counterclockwise to move the movable plate 2 forwardly as shown in FIG. 10, the starting point $P_1$ of the pivotal movement of the eccentric shaft portion 3b, which establish the contact condition between the contact 4 and the IC lead 5a is set in the fourth quadrant of the coordinates formed by the X-axis and the Y-axis passing through a central point of the pivotal movement of the crank shaft portion 3a, and a terminal point $P_2$ of the pivotal movement of the eccentric shaft portion 3b, at which the contact release condition is established between the contact 4 and the IC lead 5a, is set in the first or second quadrant, so that when the eccentric shaft portion 3b is located at the starting point $P_1$ of the pivotal movement in the fourth quadrant, the IC lead 5a and the contact 4 is in a contact relation with each other. Similarly, when the crank lever 3 is operated to pivot counterclockwise from the starting point $P_1$ of the pivotal movement in the fourth quadrant to the terminal point $P_2$ of the pivotal movement in the first or second quadrant as shown in FIG. 10, the contact release condition is established.

The remainder of the description is the same as in the preceding embodiment in which the starting point $P_1$ of the pivotal movement of the eccentric shaft portion 3b is located in the third quadrant.

Whether the starting point $P_1$ of the pivotal movement is set in the third quadrant or the fourth quadrant depends on whether the crank shaft portion 3a of the crank lever 3 is mounted on one side of the socket body 1 and movable plate 2 or on the other side thereof.

As apparent from the description above, in any of the embodiments, the eccentric shaft portion 3b has the starting point $P_1$ of the pivotal movement disposed below X-axis (i.e. in the third or fourth quadrant), and the contact condition or relation between the contact 4 and the IC lead 5a is established when the eccentric shaft portion 3b stands still at this starting point $P_1$ of the pivotal movement.

Figure 8A:
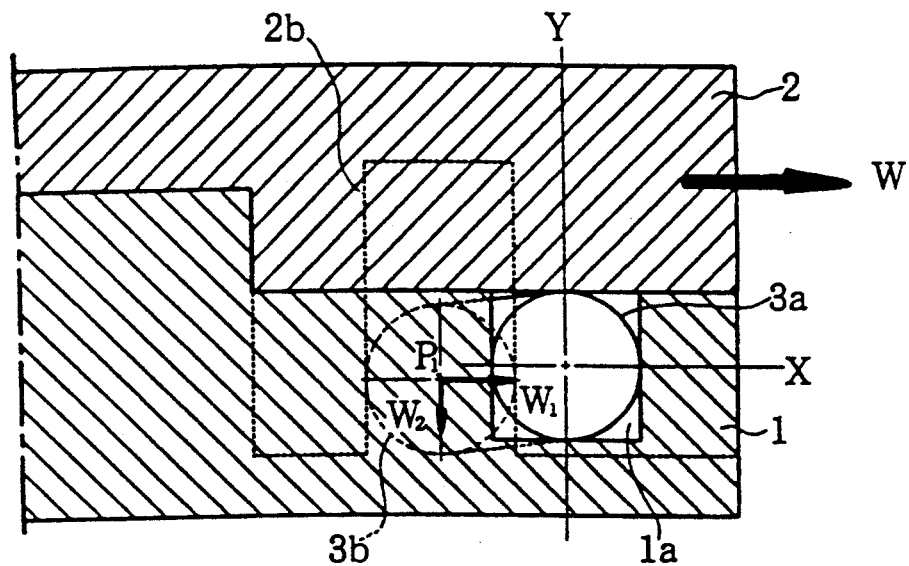
FIG. 8(A) is a sectional view of an important portion of the IC socket according to the present invention, with an eccentric shaft portion located at the starting point of its pivotal movement.
Figure 8B:
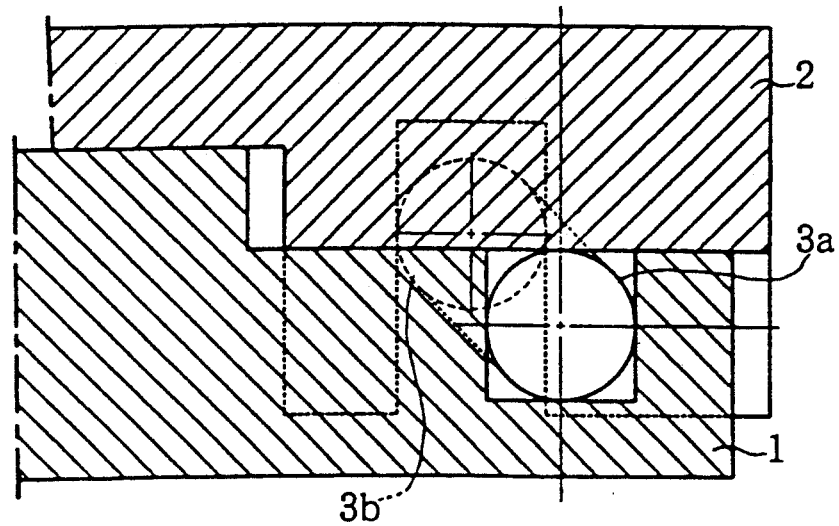
FIG. 8(B) is a sectional view similar to FIG. 8(A), but with the eccentric shaft portion located at a mid-point of the pivotal movement.
Figure 8C:
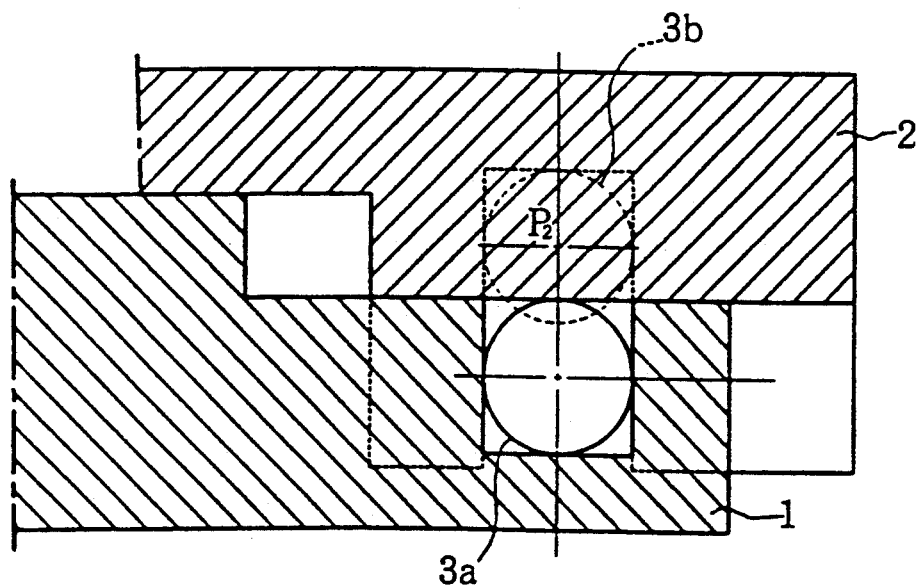
FIG. 8(C) is a sectional view similar to FIG. 8(A), but with the eccentric shaft portion located at the terminal point of the pivotal movement.
Figure 9A:
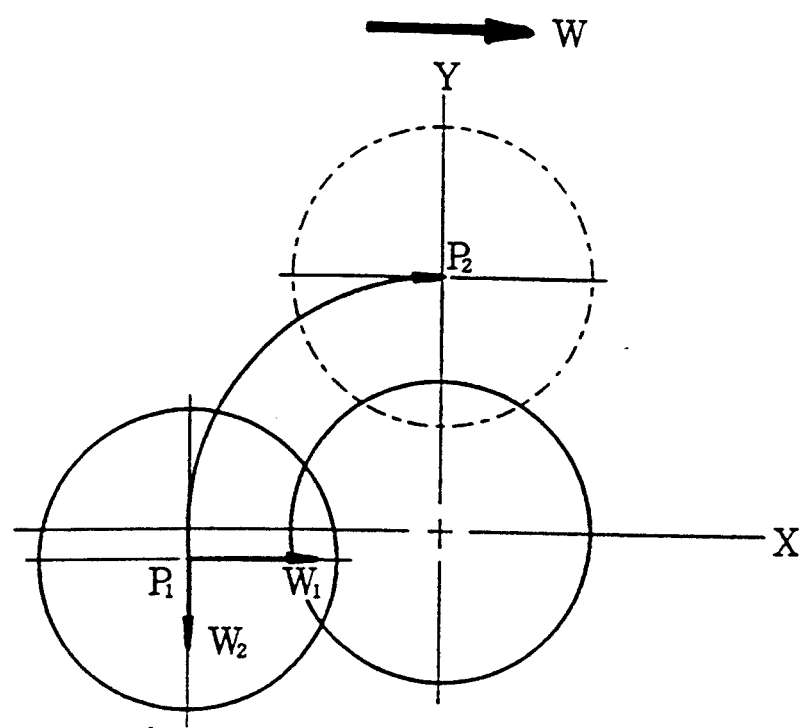
FIG. 9(A) is an explanatory view for diagrammatically explaining an arrangement of the eccentric shaft portion and a locus of the pivotal movement in the present invention.
Figure 9B:
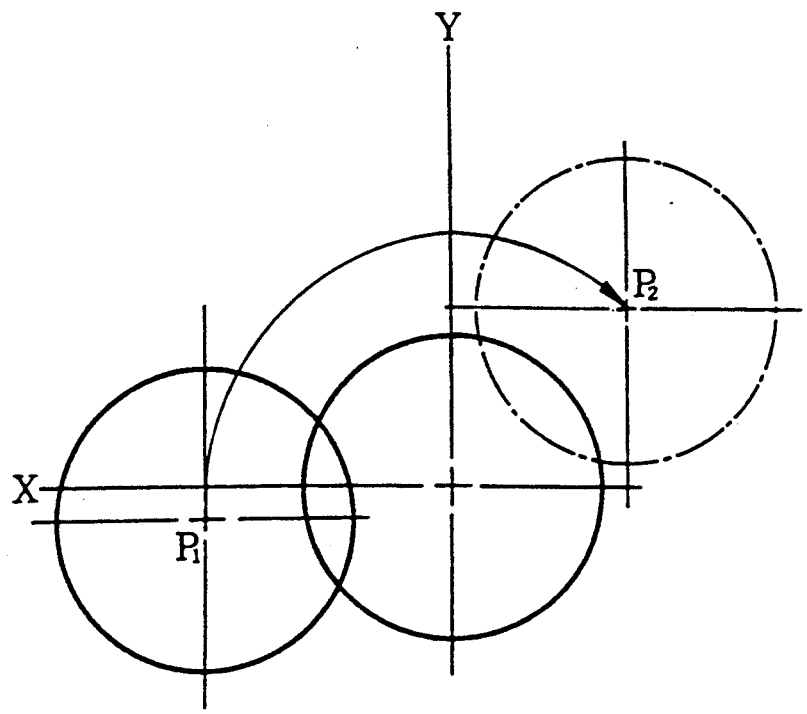
FIG. 9(B) is an explanatory view similar to FIG. 9(A), but showing the eccentric shaft portion at the final point of the pivotal movement.

When external force W a forward is applied to the movable plate 2 when the eccentric shaft portion 3b stands still at the starting point $P_1$ of the pivotal movement, component forces $W_1$ and $W_2$ directed in a horizontal direction along the X-axis and in a downward direction along the Y-axis as shown in FIGS. 8(A) and 9(A), will act against to the eccentric shaft portion 3b, and these component forces $W_1$, $W_2$, which act below the X-axis, act to positively urge the movable plate 2 in a direction opposite the forward direction.

As a result, the eccentric shaft portion 3b is maintained at the starting point $P_1$ of the pivotal movement against the external force, thus maintaining the contact condition.

As described in the foregoing, according to the present invention, when an external force attempting to move the movable plate in the horizontal direction is applied thereto, this external force will act to pivot the eccentric shaft of the crank lever in a direction opposite the direction towards the terminal point of the pivotal movement and away from the starting point of the pivotal movement. As a result, forward movement of the movable plate is effectively restrained, and the eccentric shaft portion is maintained at the starting point of the pivotal movement.

As a result, a contact condition or relation between the IC lead and the contact can be reliably maintained. Thus, the present invention is capable of effectively solving the problem that the contact condition is accidentally released by the action of an external force, which problem was inherent in the conventional crank lever type socket. In addition, the present invention solves the problem of a retaining projection adapted to prevent a sway of the crank lever caused by external force becoming broken.

While the present invention has been specifically shown and described herein, the invention itself is not to be restricted to the exact showing of the drawings and the description thereof, and various modifications can be made.

What is claimed is:

1. An IC socket comprising:
   a socket body having a contact member;
   a movable plate slidably mounted atop said socket body and adapted to receive an IC package having a lead, said movable plate being horizontally slidable along said socket body between a contact position which is adapted to cause the contact member and the lead to be in contact with one another, and a release position which allows the lead to be removed from contact with the contact member;
   a crank lever pivotably mounted to said socket body, said crank lever defining a moving means for moving said movable plate between said contact position and said release position, said crank lever comprising a crank shaft portion rotatably mounted to said socket body and an operating shaft portion extending at a substantially right angle from said crank shaft portion;
   wherein said crank shaft portion is rotatable about a rotational axis and includes an eccentric shaft portion which has a central axis offset eccentrically from said rotational axis and pivotable about said rotational axis upon rotation of said crank shaft portion;
   wherein a rectangular coordinate system is defined by a horizontal X-axis extending perpendicularly through said rotational axis, and a vertical Y-axis extending perpendicularly through said rotational axis, a first quadrant being defined above the X-axis and to the right of the Y-axis, a second quadrant being defined above the X-axis and to the left of the Y-axis, a third quadrant being defined below the X-axis and to the left of the Y-axis, and a fourth quadrant being defined below the X-axis and to the right of the Y-axis;
   wherein said operating shaft portion defines a means for pivoting said eccentric shaft portion clockwise about said rotation axis from a starting position at which said central axis of said eccentric shaft portion is disposed in said third quadrant, to a terminal position at which said central axis of said eccentric shaft portion is disposed above said X-axis, and for pivoting the eccentric shaft portion counterclockwise from said terminal position to said starting position;
   wherein said moving means is operable to move said movable plate from said contact position to said release position when said central axis of said eccentric shaft portion is pivoted from said starting position, and is operable to move said movable plate from said release position to said contact position when said central axis of said eccentric shaft portion is pivoted from said terminal position to said starting position; and
   wherein said socket body defines a means for preventing said central axis of said eccentric shaft portion from being pivoted counterclockwise from said third quadrant toward said fourth quadrant.

2. An IC socket as recited in claim 1, wherein said moving means is operable to move said movable plate from said contact position to said release position when said operating lever portion is pivoted from a substantially horizontal position to a substantially upright position.

3. An IC socket as recited in claim 1, wherein when said movable plate is in said contact position, said central axis of said eccentric shaft portion is in said starting position and said operating shaft portion is in a substantially horizontal position.

4. An IC socket as recited in claim 1, wherein in said terminal position, said central axis of said eccentric shaft portion is disposed in one of said first and second quadrants.

5. An IC socket as recited in claim 1, wherein in said terminal position, said central axis of said eccentric shaft portion is disposed on the Y-axis between said first and second quadrants.

6. An IC socket comprising:
   a socket body having a contact member;
   a movable plate slidably mounted atop said socket body and adapted to receive an IC package having a lead, said movable plate being horizontally slidable along said socket body between a contact position which is adapted to cause the contact member and the lead to be in contact with one another, and a release position which allows the lead to be removed from contact with the contact member;
   a crank lever pivotably mounted to said socket body, said crank lever defining a moving means for moving said movable plate between said contact position and said release position, said crank lever comprising a crank shaft portion rotatably mounted to said socket body and an operating shaft portion extending at a substantially right angle from said crank shaft portion;
   wherein said crank shaft portion is rotatable about a rotational axis and includes an eccentric shaft portion which has a central axis offset eccentrically from said rotational axis and pivotable about said rotational axis upon rotation of said crank shaft portion;

wherein a rectangular coordinate system is defined by a horizontal X-axis extending perpendicularly through said rotational axis, and a vertical Y-axis extending perpendicularly through said rotational axis, a first quadrant being defined above the X-axis and to the right of the Y-axis, a second quadrant being defined above the X-axis and to the left of the Y-axis, a third quadrant being defined below the X-axis and to the left of the Y-axis, and a fourth quadrant being defined below the X-axis and to the right of the Y-axis;

wherein said operating shaft portion defines a means for pivoting said eccentric shaft portion counterclockwise about said rotation axis from a starting position at which said central axis of said eccentric shaft portion is disposed in said fourth quadrant, to a terminal position at which said central axis of said eccentric shaft portion is disposed above said X-axis, and for pivoting the eccentric shaft portion counterclockwise from said terminal position to said starting position;

wherein said moving means is operable to move said movable plate from said contact position to said release position when said central axis of said eccentric shaft portion is pivoted from said starting position, and is operable to move said movable plate from said release position to said contact position when said central axis of said eccentric shaft portion is pivoted from said terminal position to said starting position; and wherein said socket body defines a means for preventing said central axis of said eccentric shaft portion from being pivoted clockwise from said fourth quadrant toward said third quadrant.

7. An IC socket as recited in claim 6, wherein
said moving means is operable to move said movable plate from said contact position to said release position when said operating lever portion is pivoted from a substantially horizontal position to a substantially upright position.

8. An IC socket as recited in claim 6, wherein
when said movable plate is in said contact position, said central axis of said eccentric shaft portion is in said starting position and said operating shaft portion is in a substantially horizontal position.

9. An IC socket as recited in claim 6, wherein
in said terminal position, said central axis of said eccentric shaft portion is disposed in one of said first and second quadrants.

10. An IC socket as recited in claim 6, wherein
in said terminal position, said central axis of said eccentric shaft portion is disposed on the Y-axis between said first and second quadrants.

11. An IC socket comprising:
a socket body having a contact member;
a movable plate slidably mounted atop said socket body and adapted to receive an IC package having a lead, said movable plate being horizontally slidable along said socket body between a contact position which is adapted to cause the contact member and the lead to be in contact with one another, and a release position which allows the lead to be removed from contact with the contact member;

a crank lever pivotably mounted to said socket body, said crank lever defining a moving means for moving said movable plate between said contact position and said release position, said crank lever comprising a crank shaft portion rotatably mounted to said socket body and an operating shaft portion extending at a substantially right angle from said crank shaft portion;

wherein said crank shaft portion is rotatable about a rotational axis and includes an eccentric shaft portion which has a central axis offset eccentrically from said rotational axis and pivotable about said rotational axis upon rotation of said crank shaft portion;

wherein said operating shaft portion defines a means for pivoting said central axis of said eccentric shaft portion from a starting position, in which said central axis is disposed above said rotational axis, to a terminal position, in which said central axis is disposed below and offset horizontally from said rotational axis, and to thereby move said movable plate from said contact position to said release position, and for pivoting said central axis of said eccentric shaft portion from said terminal position to said starting position and to thereby move said movable plate from said release position to said contact position, such that an external force acting on said movable plate which would tend to push said movable plate from said contact position and toward said release position will tend to pivot said central axis of said eccentric shaft portion from said starting position in a direction away from said terminal position; and wherein said socket body defines a means for preventing said central axis of said eccentric shaft portion from pivoting from said starting position in a direction away from said terminal position.

12. An IC socket as recited in claim 11, wherein
in said terminal position, said central axis of said eccentric shaft portion is disposed above and in vertical alignment with said rotation axis.

13. An IC socket as recited in claim 11, wherein
in said terminal position, said central axis of said eccentric shaft portion is disposed in a position above and horizontally offset from said rotation axis.

14. An IC socket as recited in claim 11, wherein
when said movable plate is in said contact position, said central axis of said eccentric shaft portion is in said starting position and said operating shaft portion is in a substantially horizontal position.

* * * * *